US011712765B2

(12) United States Patent
Bogdan, Jr. et al.

(10) Patent No.: US 11,712,765 B2
(45) Date of Patent: Aug. 1, 2023

(54) DIODE LASER FIBER ARRAY FOR CONTOUR OF POWDER BED FABRICATION OR REPAIR

(71) Applicant: General Electric Company, Schenectady, NY (US)

(72) Inventors: David Charles Bogdan, Jr., Charlton, NY (US); Jason Harris Karp, Niskayuna, NY (US); William Thomas Carter, Galway, NY (US)

(73) Assignee: General Electric Company, Schenectady, NY (US)

( * ) Notice: Subject to any disclaimer, the term of this patent is extended or adjusted under 35 U.S.C. 154(b) by 59 days.

(21) Appl. No.: 17/397,011

(22) Filed: Aug. 9, 2021

(65) Prior Publication Data

US 2021/0370448 A1 Dec. 2, 2021

Related U.S. Application Data

(63) Continuation of application No. 15/794,225, filed on Oct. 26, 2017, now Pat. No. 11,084,132.

(51) Int. Cl.
*B33Y 10/00* (2015.01)
*B33Y 30/00* (2015.01)
(Continued)

(52) U.S. Cl.
CPC .......... *B23P 6/007* (2013.01); *B23K 26/0006* (2013.01); *B23K 26/0604* (2013.01);
(Continued)

(58) Field of Classification Search
CPC ..... B23P 6/007; B29C 64/277; B29C 64/153; B29C 64/393; B23K 26/0006;
(Continued)

(56) References Cited

U.S. PATENT DOCUMENTS 5,155,324 A 10/1992 Deckard et al.
5,764,833 A 6/1998 Kakii et al.
(Continued)

FOREIGN PATENT DOCUMENTS

DE 4234342 A1 4/1994
DE 102016013854 A1 5/2017
(Continued)

OTHER PUBLICATIONS

Abe et al., The Manufacturing of Hard Tools from Metallic Powders by Selective Laser Melting, Journal of Materials Processing Technology, Elsevier, vol. 111, Issues 1-3, Apr. 25, 2001, pp. 210-213. (Abstract Only).

(Continued)

*Primary Examiner* — Moshe Wilensky
(74) *Attorney, Agent, or Firm* — Dority & Manning, P.A.

(57) ABSTRACT

A method of forming a build in a powder bed includes providing a first diode laser fiber array and a second diode laser fiber array, emitting a plurality of laser beams from selected fibers of the second diode laser fiber array onto the powder bed, corresponding to a pattern of a layer of the build, simultaneously melting powder in the powder bed corresponding to the pattern of the layer of the build, scanning a first diode laser fiber array along an outer boundary of the powder bed and emitting a plurality of laser beams from selected fibers of the first diode laser fiber array and simultaneously melting powder in the powder bed corresponding to the outer boundary of the layer of the build to contour the layer of the build. An apparatus for forming a build in a powder bed including a first diode laser fiber array and a second diode laser fiber array is also disclosed. The first diode laser fiber array configured to contour the layer of the build.

20 Claims, 7 Drawing Sheets

(51) Int. Cl.

| | |
|---|---|
| B23P 6/00 | (2006.01) |
| H01S 5/40 | (2006.01) |
| G02B 6/42 | (2006.01) |
| B29C 64/153 | (2017.01) |
| B28B 1/00 | (2006.01) |
| C03B 19/01 | (2006.01) |
| F01D 5/00 | (2006.01) |
| B23K 26/342 | (2014.01) |
| B23K 26/10 | (2006.01) |
| B23K 26/06 | (2014.01) |
| B23K 26/08 | (2014.01) |
| B23K 26/0622 | (2014.01) |
| B23K 26/00 | (2014.01) |
| B29C 64/277 | (2017.01) |
| B33Y 80/00 | (2015.01) |
| B29C 64/393 | (2017.01) |
| B33Y 50/02 | (2015.01) |
| B23K 103/00 | (2006.01) |
| B23K 103/18 | (2006.01) |

(52) U.S. Cl.
CPC ...... *B23K 26/0622* (2015.10); *B23K 26/0626* (2013.01); *B23K 26/0823* (2013.01); *B23K 26/0869* (2013.01); *B23K 26/103* (2013.01); *B23K 26/342* (2015.10); *B28B 1/001* (2013.01); *B29C 64/153* (2017.08); *B29C 64/277* (2017.08); *B33Y 10/00* (2014.12); *B33Y 30/00* (2014.12); *C03B 19/01* (2013.01); *F01D 5/005* (2013.01); *G02B 6/425* (2013.01); *G02B 6/4296* (2013.01); *H01S 5/4081* (2013.01); *B23K 2103/26* (2018.08); *B23K 2103/42* (2018.08); *B23K 2103/52* (2018.08); *B23K 2103/54* (2018.08); *B29C 64/393* (2017.08); *B33Y 50/02* (2014.12); *B33Y 80/00* (2014.12)

(58) Field of Classification Search
CPC ............ B23K 26/0626; B23K 26/0622; B23K 26/0823; B23K 26/0869; B23K 26/0604; B23K 26/103; B23K 26/342; B23K 2103/42; B23K 2103/26; B23K 2103/54; B23K 2103/52; F01D 5/005; C03B 19/01; B28B 1/001; B33Y 30/00; B33Y 10/00; B33Y 50/02; B33Y 80/00; G02B 6/425; G02B 6/4296; H01S 5/4081
See application file for complete search history.

(56) References Cited

U.S. PATENT DOCUMENTS

| | | |
|---|---|---|
| 5,985,204 A | 11/1999 | Otsuka et al. |
| 6,272,155 B1 | 8/2001 | Sekiguchi |
| 7,006,120 B2 | 2/2006 | Sakai et al. |
| 9,221,100 B2 | 12/2015 | Schwarze et al. |
| 9,296,123 B2 | 3/2016 | Dezon-Gaillard et al. |
| 10,588,347 B2 | 3/2020 | Malgat et al. |
| 2004/0094728 A1 | 5/2004 | Herzog et al. |
| 2005/0281516 A1 | 12/2005 | Okazaki et al. |
| 2007/0151963 A1 | 7/2007 | Tanaka et al. |
| 2009/0326706 A1 | 12/2009 | Fink et al. |
| 2010/0233012 A1 | 9/2010 | Higashi et al. |
| 2013/0112672 A1 | 5/2013 | Keremes et al. |
| 2013/0270750 A1 | 10/2013 | Green |
| 2014/0198365 A1 | 7/2014 | Li et al. |
| 2014/0252687 A1 | 9/2014 | El-Dasher et al. |
| 2015/0048064 A1 | 2/2015 | Cheverton et al. |
| 2015/0165556 A1 | 6/2015 | Jones et al. |
| 2016/0082668 A1 | 3/2016 | Perret et al. |
| 2016/0311230 A1 | 10/2016 | Conrads et al. |
| 2017/0197248 A1 | 7/2017 | Giuletti |
| 2018/0326655 A1 | 11/2018 | Herzog |

FOREIGN PATENT DOCUMENTS

| | | |
|---|---|---|
| EP | 0958912 A1 | 11/1999 |
| EP | 3202514 A1 | 8/2017 |
| JP | 2009006509 A | 1/2009 |
| WO | WO2016/085965 A1 | 6/2016 |
| WO | WO2017/015241 A1 | 1/2017 |

OTHER PUBLICATIONS

Aimangour et al., Improving the Surface Quality and Mechanical Properties by Shot-Peening of 17-4 Stainless Steel Fabricated by Additive Manufacturing, Materials & Design, vol. 110, Nov. 15, 2016, pp. 914-924.

Calignano et al., Influence of Process Parameters on Surface Roughness of Aluminum Parts Produced by DMLS, The International Journal of Advanced Manufacturing Technology, vol. 67, Issue 9, Aug. 2013, pp. 2743-2751.

Eibl et al, "Alternative bean sources and machine concepts for laser powder bed fusion", Fraunhofer-Institute for Laser Technology, Germany, 2017, pp. 7-8.

Yu et al, Investigation of collimating and focusing lenses' impact on laser diode stack beam parameter product, Applied Optics, vol. 54, No. 34, Italy, Dec. 1, 2015, pp. 10240-10248.

Zavala-Arredondo et al., Diode area melting single-layer parametric analysis of 316L stainless steel powder, The International Journal of Advanced Manufacturing Technology, vol. 94, 2018, pp. 2563-2576.

Zavala-Arredondo et al., Laser Diode Area Melting for High Speed Additive Manufactuiing of Metallic Components, Material & Design, vol. 117, United Kingdom, 2017, pp. 305-315.

DIODE LASER FIBER ARRAY FOR CONTOUR OF POWDER BED FABRICATION OR REPAIR

CROSS-REFERENCE TO RELATED APPLICATION

This application is a continuation application of U.S. application Ser. No. 15/794,225 filed Oct. 26, 2017, titled "DIODE LASER FIBER ARRAY FOR CONTOUR OF POWDER BED FABRICATION OR REPAIR," herein incorporated by reference.

BACKGROUND

The present technology relates generally to the use of a diode laser fiber array for Direct Metal Laser Melting (DMLM) for use in the fabrication or repair of components, more particularly components of a gas turbine engine.

Additive manufacturing is a known technology that enables the "3D-printing" of components of various materials including metals, ceramics and plastics. In additive manufacturing, a part is built in a layer-by-layer manner by leveling metal powder and selectively fusing the powder using a high-power laser or electron beam. After each layer, more powder is added and the laser forms the next layer, simultaneously fusing it to the prior layers to fabricate a complete component buried in a powder bed. Additive manufacturing systems and processes are used to fabricate precision three-dimensional components from a digital model.

In making a build in current powder bed systems, the laser beam or electron beam is used to scan a layer of powder to sinter and melt the desired shape in the layers of the powder bed. In many instances, one-dimensional (1D) or two-dimensional (2D) arrays of relatively low power lasers may be used to make cost effective parts when compared to conventional high power lasers used with a galvanometer scanner in DMLM. When using a 1D or 2D array of lasers to both scan the interior and boundaries of a part, the same spacing that is optimal for filling the interior of the part is likely to create a rough edge on the boundary of the part. This detracts from the surface finish on the final part, as well as the effective resolution of the printing.

Accordingly, there is a need for a DMLM system that uses a 1D or 2D array of lasers that is configured to improve the resolution and surface finish of the part, resulting in a reduction in the cost of manufacturing while still maintaining the part quality of conventional DMLM.

BRIEF DESCRIPTION

Various embodiments of the disclosure include a method and apparatus for contouring a build in a powder bed. In accordance with one exemplary embodiment, disclosed is a method of contouring a build in a powder bed. The method including scanning a first diode laser fiber array comprising a plurality of diode lasers along an outer boundary of the build in the powder bed, emitting a plurality of laser beams from selected fibers of the first diode laser fiber array during the scanning of the first diode laser fiber array along the outer boundary of the build in the powder bed and simultaneously melting powder in the powder bed corresponding to the boundary of the layer of the build to contour the layer of the build.

In accordance with another exemplary embodiment, disclosed is a method of contouring a build in a powder bed including providing a first diode laser fiber array and a second diode laser fiber array, emitting a plurality of laser beams from selected fibers of the second diode laser fiber array onto the powder bed, simultaneously melting powder in the powder bed corresponding to the pattern of the layer of the build, scanning a first diode laser fiber array along an outer boundary of the powder bed and emitting a plurality of laser beams from selected fibers of the first diode laser fiber array during the scanning of the first diode laser fiber array along the outer boundary of the layer of the build in the powder bed and simultaneously melting powder in the powder bed corresponding to the outer boundary of the layer of the build to contour the layer of the build. The selected fibers of the second diode laser fiber array correspond to a pattern of a layer of the build.

In accordance with yet another exemplary embodiment, disclosed is an apparatus for forming a build in a powder bed. The apparatus includes a first diode laser fiber array comprising a plurality of diode lasers and a plurality of optical fibers corresponding to the plurality of diode lasers, a second diode laser fiber array comprising a plurality of diode lasers and a plurality of optical fibers corresponding to the plurality of diode lasers, a support configured to support a powder bed or a component configured to support the powder bed at a distance from ends of the optical fibers of the first diode laser fiber array and the second diode laser fiber array and a controller configured to control the second diode laser fiber array to emit a plurality of laser beams from selected fibers of the second diode laser fiber array onto the powder bed. Each optical fiber of the first diode laser fiber array is configured to receive a laser beam from a respective diode laser and configured to emit the laser beam. Each optical fiber of the second diode laser fiber array is-configured to receive a laser beam from a respective diode laser and configured to emit the laser beam. The selected fibers of the second diode laser fiber array correspond to a pattern of a layer of the build and simultaneously melt the powder in the powder bed corresponding to the pattern of the layer of the build. The controller is configured to control the first diode laser fiber array to emit a plurality of laser beams from selected fibers of the first diode laser fiber array onto an outer boundary of the layer of the build in the powder bed. The selected fibers of the first diode laser fiber array correspond to the outer boundary of the layer of the build and simultaneously melt the powder in the powder bed.

Other objects and advantages of the present disclosure will become apparent upon reading the following detailed description and the appended claims with reference to the accompanying drawings. These and other features and improvements of the present application will become apparent to one of ordinary skill in the art upon review of the following detailed description when taken in conjunction with the several drawings and the appended claims.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

DETAILED DESCRIPTION

Figure 1A:
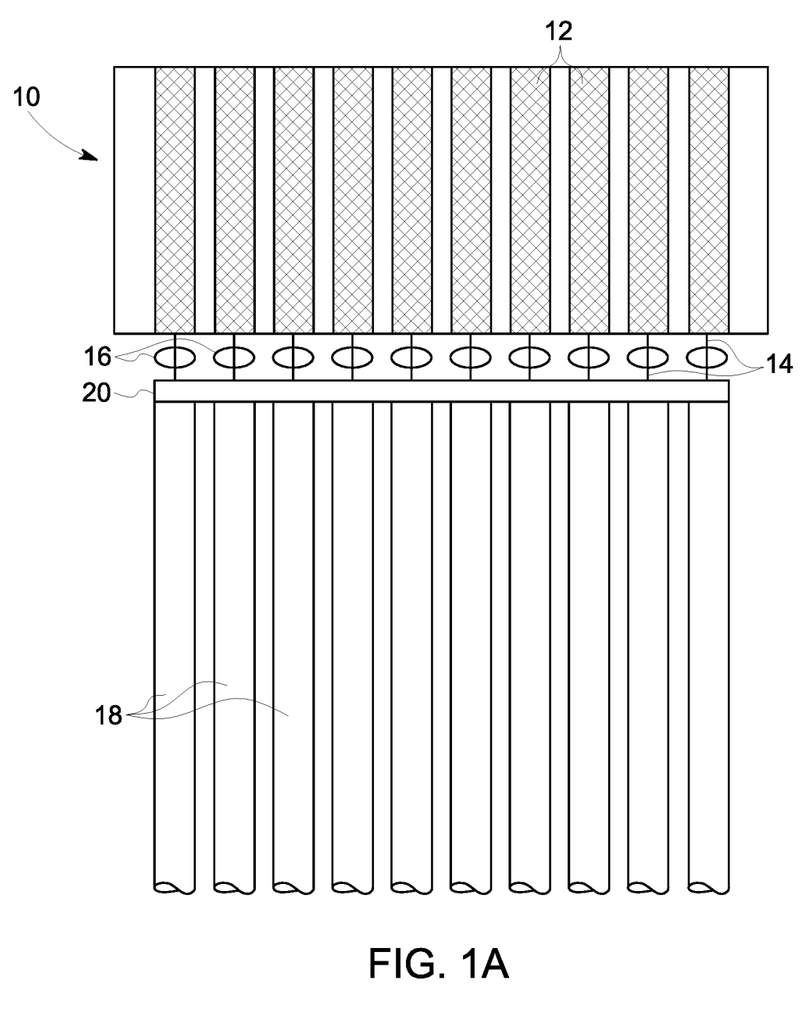
FIG. 1A schematically illustrates a diode laser fiber array for use with the present technology.

Referring to FIG. 1A, a diode laser array 10 (e.g., a diode laser bar or stack) includes a plurality of diode lasers, or emitters, 12, each emitting a beam of radiation 14. A plurality of cylindrical lenses 16 are positioned between the diode lasers 12 and a plurality of optical fibers 18 to couple each diode laser 12 to at least one of the plurality of optical fibers 18. The plurality of optical fibers 18 may be provided in a bundle 20 between the diode laser array and the free ends of the optical fibers, as shown for example in FIGS. 1A-1C. However, it should be appreciated that diode fiber laser arrays that do not use coupling optics may be used with the present technology, as discussed below.

Figure 1B:
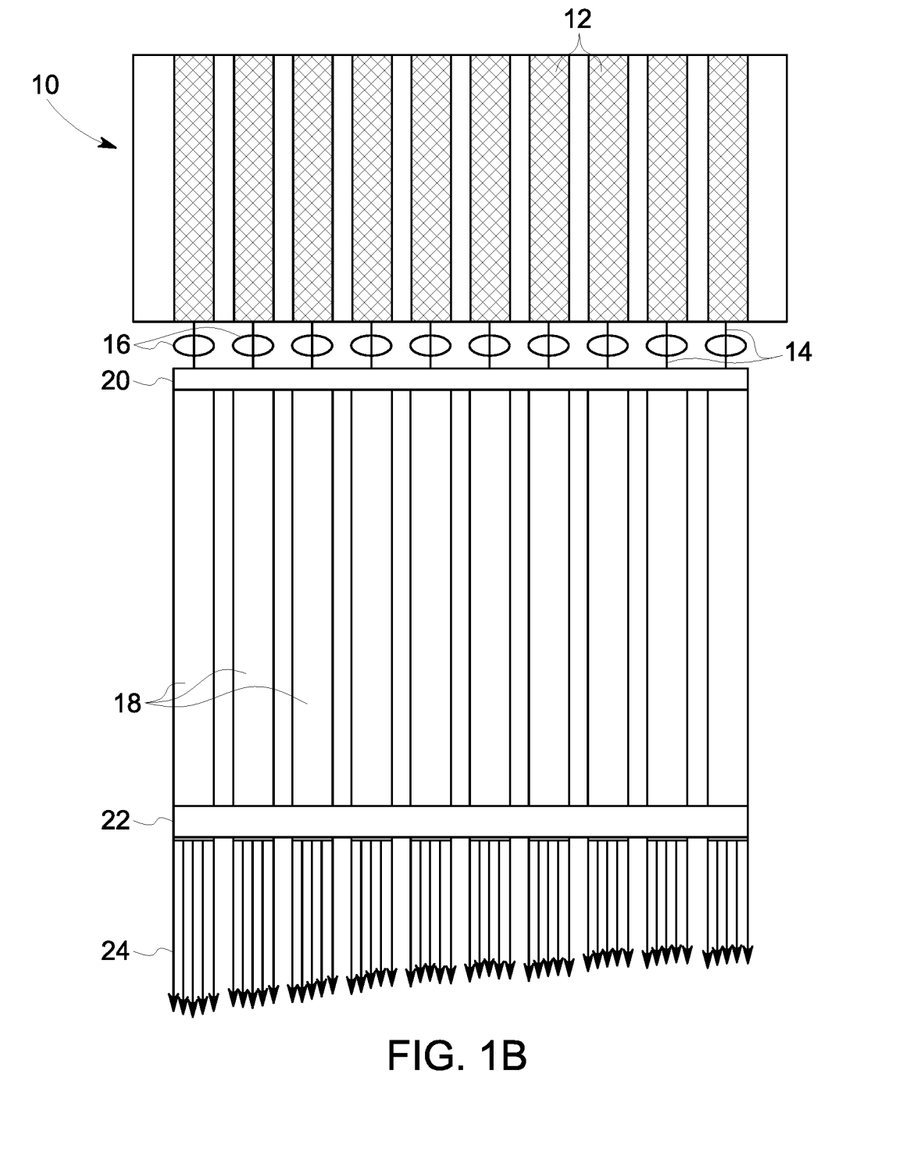
FIG. 1B schematically illustrates another diode laser fiber array for use with the present technology.
Figure 1C:
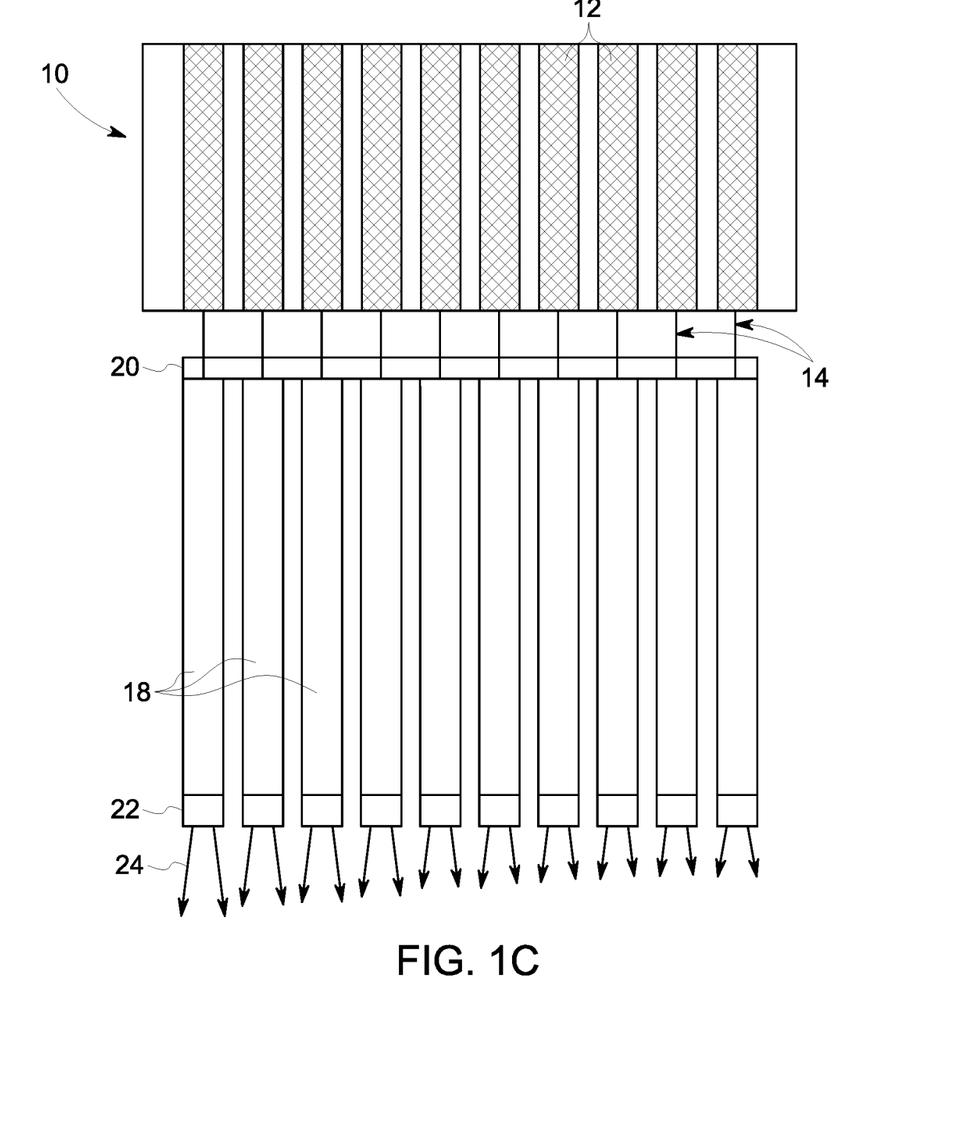
FIG. 1C schematically illustrates another diode laser fiber array for use with the present technology.

Referring to FIG. 1B, the diode laser fiber array 10 may include a single lens 22, or multiples lenses 22 as best illustrated in FIG. 1C, at the ends of the optical fibers 18. The lenses 22 may be configured to provide collimated laser beams 24 from the optical fibers 18. Referring to FIG. 1C, the diode laser fiber array 10 may not include optics (e.g. a lens) between the diode lasers 12 and the optical fibers 18 and the beams of radiation 14 may be received by the optical fibers 18 in proximity to the diode lasers 12. The optical fibers 18 may have lenses 22 at their respective ends. The lenses 22 may be configured to provide a predetermined divergence to the laser beams 24 emitted from the optical fibers 18. It should also be appreciated that instead of providing lenses that the ends of the optical fibers 18 may be shaped to provide collimated or divergent laser beams 24.

Figure 2:
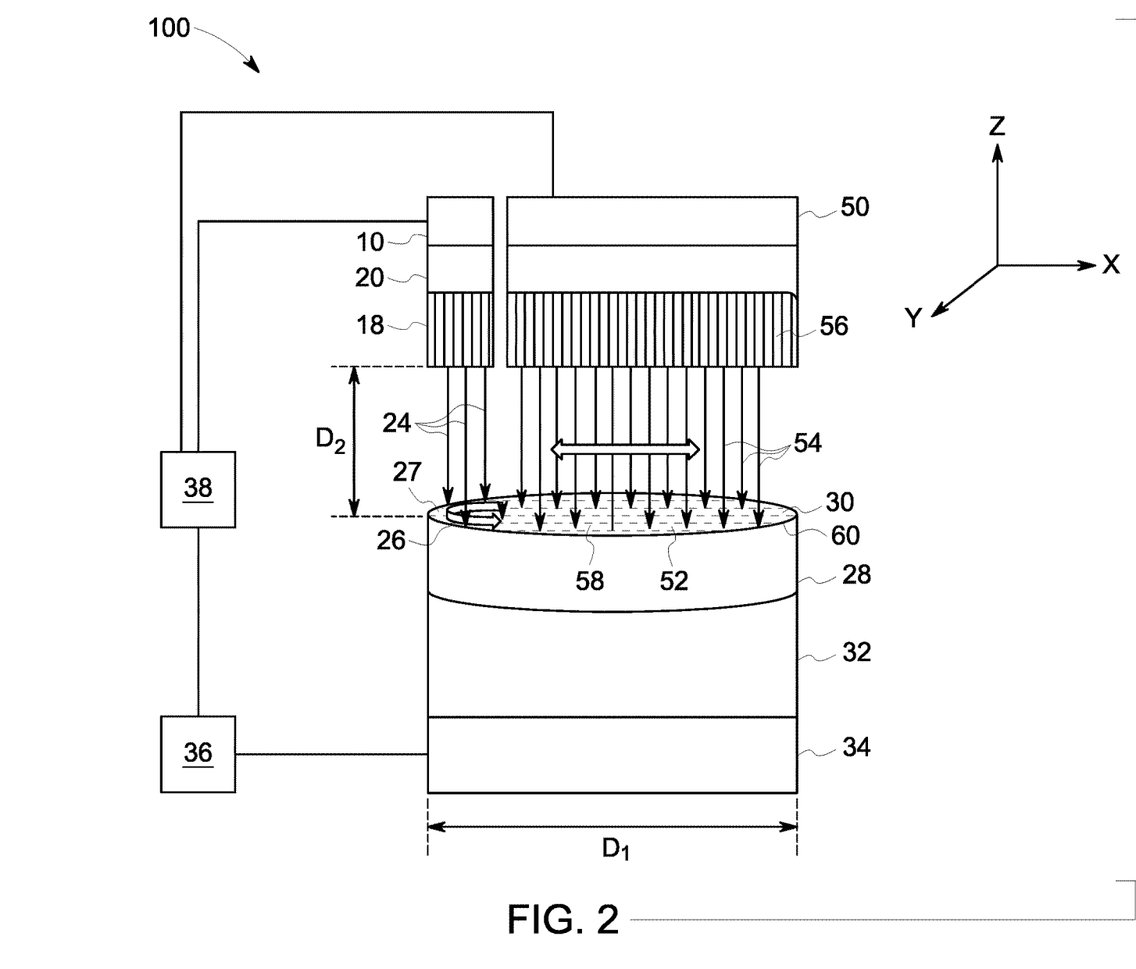
FIG. 2 schematically illustrates a system for contouring of a powder bed layer by a diode laser fiber array according to an example of the present technology.

Referring to FIG. 2, illustrated is an embodiment of a system 100 for contour of powder bed fabrication or repair. The system 100 includes a first diode laser fiber array 10 for contouring of the outer boundary 26, as previously described with regard to FIGS. 1A-1C, and a second diode laser fiber array 50 for fabrication of the layers of the build according to well-known DMLM practices. In an embodiment, during the build process, the second diode laser fiber array 50 scans, for example, a dimension $D_1$ of the build part 30 in a plurality of hatching scan paths 52, as indicated schematically by dashed lines. More particularly, the second diode laser fiber array 50 directs a plurality of laser beams 54 from a plurality of optical fibers 56 into a powder bed 58 to simultaneously melt the desired powder forming a layer 60. In an embodiment, the hatching paths 52 created by the second diode laser fiber array 50 typically extend to the outer boundary 26, or part edge, for example within 100 um. Subsequent to completion of the hatching scan paths 52 by the second diode laser fiber array 50 and buildup of the layer 60, the first diode laser fiber array 10 scans about the outer boundary 26 of the part, as indicated by directional arrow, to contour the layer 60 and provide improved resolution and surface finish to the layer 60. More particularly, the first diode laser fiber array 10 contours the part perimeter or outer boundary 26 and a portion 27 inset from the edge a few beam widths (200 or 300 um). In an embodiment, and initial contouring step may take place prior to hatching, with another contouring step subsequent to hatching.

During contouring, the first diode laser fiber array 10 contours about the outer boundary 26 and overlaps the hatching paths 52 to fill in any gaps between the hatching paths 52 proximate the outer boundary 26 that would lead to porosity at the surface. In an embodiment, during operation, the first diode laser fiber array 10 directs laser beams 24 from the optical fibers 18 about an outer boundary 26 of the build 30 and into the powder bed 28 to simultaneously melt all of the desired powder. By sweeping the first diode laser fiber array 10 about the outer boundary 26, as indicated by directional arrow, the layer 60 is contoured and has an improved resolution and surface finish. To generate the desired sweeping of the diode lasers 12 about the outer boundary 26, for example of a repair or of a component being fabricated, the required diode lasers 12 are configured to affect the desired melting from each fiber 18.

The powder bed 28 may be provided on a component 32, for example an airfoil of a gas turbine engine of an aircraft, which is supported on a support 34 to provide a repair to the component 32. Although the present technology may be applicable to the repair function on components, it should be appreciated that the present technology is applicable for the additive manufacturing build of new make components. The powder bed may be provided on the support 34.

In an embodiment, subsequent to fabrication of the inner portion of the layer 60, the diode laser fiber array 10 may be moved about the outer boundary 26 by an actuator or an actuator system 36 that is configured to rotate the diode laser fiber array 10 about the z-axis as shown in FIG. 2. In another embodiment, the support 34 may be moved by an actuator or an actuator system 36 that is configured to rotate the support 34 about the z-axis. The actuator or actuator system 36 may be controlled by controller 38 that is configured to control the actuator or actuator system 36 and the first diode laser fiber array 10. In an embodiment, the controller 38 may further be configured to control the second diode laser fiber array 50. The actuator or actuator system 36 may include, for example, a linear motor(s) and/or hydraulic and/or pneumatic piston(s) and/or a screw drive mechanism(s) and/or a conveyor.

A distance $D_2$ between the array of optical fibers 18 of the first diode laser fiber array 10 (i.e. the ends of the optical fibers 18) and the powder bed 28 may be controlled by moving at least one of the first diode laser fiber array 10 or the support 34 in the Z direction. The distance $D_2$ may depend on the type of laser beams 24 emitted by the optical fibers 18 (e.g. whether the laser beams 24 are collimated or divergent, and the amount of divergence), the average output power of each diode laser 12, the pulse energy of each diode laser 12, the pulse width of each diode laser 12, and or the beam distribution (e.g. Gaussian, top hat, etc.). The ends of the optical fibers 18 may be located at a distance above the powder bed 28 so that the outer boundary 26 of the layer 60 of the powder bed 28 can be melted by turning the required diode lasers 12 on. In an embodiment, the optical fibers 18 may be located approximately 100 mm above the powder bed 18. Each diode laser 12 of the first diode laser fiber array 10 is physically arranged to give both an optimal spacing between laser spots, and an optimal timing if offset in the same direction as the scan. Each diode laser 12 may be arranged (described presently) in a line at a particular angle (staggered), having closer spacing than the interior hatching lasers of the second diode laser fiber array 50, and of various power levels, all optimized to the material and build speed.

The controller 38 controls the turning on and turning off of each diode laser 12 of the first diode laser fiber array 50. The controller may also control the rate at which the power of each diode laser 12 is reduced when turned off. The controller 38 may turn each diode laser 12 on and off within a time frame of, for example, about 5 to 15 milliseconds, or longer if needed. For a given layer of powder 28, for example above an airfoil, the desired laser diodes 12 are activated to melt the powder about the outer boundary 26, which may be input and/or stored in the controller 38. This process may be repeated as many times as necessary, and for each layer 60 of the build 30. The controller 38 controls the actuator or actuator 36 to move at least one of the first diode laser fiber array 10 and the support 34 as layers of powder are added and subsequently processed by the first diode laser fiber arrays 10 to provide the required contouring about the outer boundary 26.

The controller 38 may be a computer processor or other logic-based device, software components (e.g., software applications), and/or a combination of hardware components and software components (e.g., a computer processor or other logic-based device and associated software application, a computer processor, or other logic-based device having hard-wired control instructions, or the like).

Figure 3:
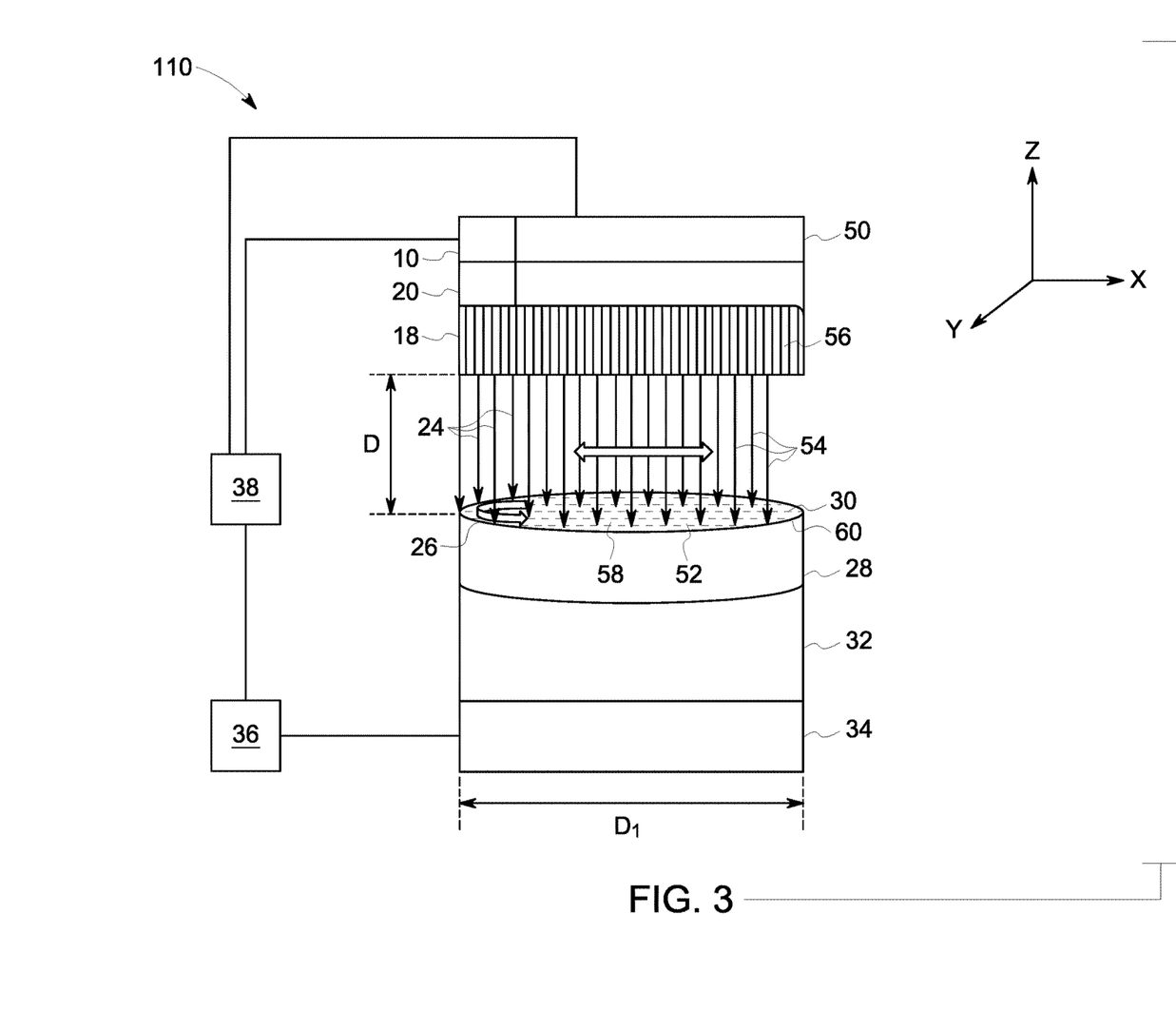
FIG. 3 schematically illustrates another embodiment of a system for contouring of a powder bed layer by a diode laser fiber array according to an example of the present technology.

Referring now to FIG. 3, illustrated is another embodiment of a system 110 for contour of powder bed fabrication or repair. Unless otherwise indicated, the second preferred embodiment of the system for contour of powder bed fabrication or repair includes the same components identified during the description of the first preferred embodiment of FIG. 2. In contrast to the embodiment of FIG. 2, in this particular embodiment the system 110 includes a single diode laser fiber array 70, having integrally formed a first diode laser fiber array 10 for contouring of the outer boundary 26, as previously described with regard to FIGS. 1A-1C and a second diode laser fiber array 50 for fabrication of the layers of the build according to well-known DMLM practices. Similar to the previous embodiment, each of the first diode laser fiber array 10 and the second diode laser fiber array 50 are independently operable.

Referring still to FIG. 3, the second diode laser fiber array 50 provides for fabrication of each layer 60 via a hatching scan pattern that defines a plurality of hatching scan paths 52. Subsequent to completion of the hatching scan paths 52 used to fill in the central portion of the build 30 with the second diode laser fiber array 50, the first diode laser fiber array 10 scans the layer 60 about the outer boundary 26 of the build. More particularly, the first diode laser fiber array 10 contours the build perimeter and a portion inset from a perimeter edge a few beam widths (200 or 300 um). The hatching paths 52 created by the second diode laser fiber array 50 extend to the build edge, for example within 100 um. During contouring, the diode laser fiber array 10 contours about the outer boundary 26 and overlaps the hatching paths 52 to fill in any gaps that may have been formed between the hatching paths 52 and that would lead to porosity at the surface of the layer 60.

The single diode laser fiber array 70, and more specifically, the first diode laser fiber array 10 may be moved by an actuator or an actuator system 36 that is configured to move the first diode laser fiber array 10 so as to rotate it about the z-axis as shown in FIG. 3. In another embodiment, in lieu of rotation of the first diode laser fiber array 10, or in addition to, the support 34 may be moved by the actuator or the actuator system 36 so as to additionally rotate the support 34 about the z-axis, such as in the x-y plane about the z-axis. The actuator or actuator system 36 may be controlled by controller 38 that is configured to control the actuator or actuator system 36 and the single diode laser fiber array 70.

As in the embodiment of FIG. 2, the distance D between the array of optical fibers 18 (i.e. the ends of the optical fibers 18) of the single diode laser fiber array 70, and the powder bed 28 may be controlled by moving at least one of the array 70 or the support 34 in the z direction. The distance D may depend on the type of laser beams 24 emitted by the optical fibers 18 (e.g. whether the laser beams 24 are collimated or divergent, and the amount of divergence), the average output power of each diode laser 12, the pulse energy of each diode laser 12, the pulse width of each diode laser 12, and or the beam distribution (e.g. Gaussian, top hat, etc.).

The controller 38 controls the turning on and turning off of each diode laser 12 in each array 10, 50. The controller may also control the rate at which the power of each diode laser 12 is reduced when turned off. The controller 38 may turn each diode laser 12 on and off within a time frame of, for example, about 5 to 15 milliseconds, or longer if needed. For a given layer of powder 28, for example above an airfoil, the desired laser diodes 12 of the first diode laser fiber array are activated to melt the powder about the outer boundary 26, which may be input and/or stored in the controller 38. This process may be repeated as many times, and on each subsequent layer 60 of the build as necessary. The controller 38 controls the actuator or actuator 36 to move at least one of the diode laser fiber array 10 and the support 34 as layers of powder are added and subsequently processed by the diode laser fiber array 10 to provide the required contouring about the outer boundary 26.

With regard to the system 100 of FIG. 2 and the system 110 of FIG. 3, each of the first diode laser fiber array 10 and the second diode laser fiber array 50 may be controlled by the controller 38 to control the heat of powder near or adjacent to the melted region to control the cooling rate of the melted region. The controller 38 may also control each of the first diode laser fiber array 10 and the second diode laser fiber array 50 to preheat the powder bed 28 and/or the component 32. The pre-heating power densities of the diode lasers 12 may be from about 10-10,000 watts/cm$^2$. By pre-heating the powder bed 28 and/or the component 32 and/or heating the region near or adjacent to the melt region, the thermal gradient may be controlled. This may help with materials that are crack sensitive to fast solidification cooling rates. Desirable grain growth that is normal to the layer surface may be achievable with planar cooling of a powder bed layer. This allows formation of a directionally solidified (DS) type grain structure and a single crystal structure with the build repair of an airfoil type structure. It should also be appreciated that the diode lasers 12 may be controlled to superheat the powder bed 28 to control the viscosity of the melted region. Controlling the viscosity of the melted region allows control over, for example, evaporation of the powder, the grain structure of the solidified layer, and/or the surface finish of the repair or component.

The material in the powder bed 28 may be metal powder, for example, CoCrMo powder. It should be appreciated that other materials, for example plastic, ceramic, or glass, may be used for the powder bed. Depending on the material in the powder bed, the power of each diode laser 12 may be from about 10 to about 60 watts. The power of the diode lasers 12 of each of the first diode laser fiber array 10 and the second diode laser fiber array 50 may be related to the diameter of the optical fibers 18 used. In an embodiment, the power density of the diode lasers 12 of the first diode laser fiber array 10 and the second diode laser fiber array 50 may be up to about 1,000,000 watts/cm$^2$ for melting the powder within a layer from each fiber.

It should be appreciated that optical fibers 18 of various cross-sections, may be used. For example, square fibers may be used to increase fiber packing. The melt pool size produced by the laser beam(s) 24 from each optical fiber 18 of each of the first diode laser fiber array 10 and the second diode laser fiber array 50 corresponds to the effective laser spot size produced by the laser beam(s) 24. In the case of collimated laser beams 24, the melt pool size corresponds generally to the diameter of a fiber core (not shown). However, the laser beams 24 from the fibers 18 may be controlled to produce a melt pool size that is, for example, two to four times as large as the diameter of the fiber core. The laser beams 24 may be controlled to have a divergence to provide a melt pool size larger than the diameter of the fiber core. In the case of divergent laser beams 24, the distance D from the ends of the fibers 18 of the array 10 to the powder bed 28 will also influence the melt pool size of each fiber. The pulse width of the laser beams and the laser beam profiles may also be controlled to adjust the melt pool size provided by each fiber.

Figure 4A:
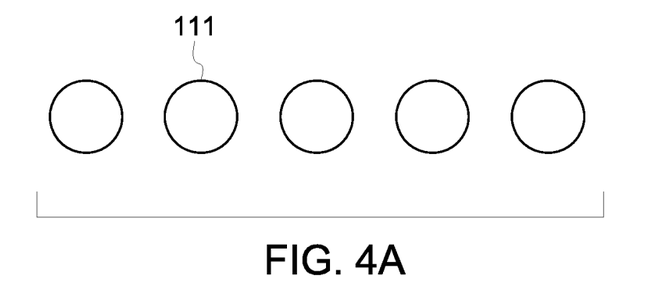
FIG. 4A schematically illustrates a fiber array usable with the system according to the present technology.
Figure 4B:
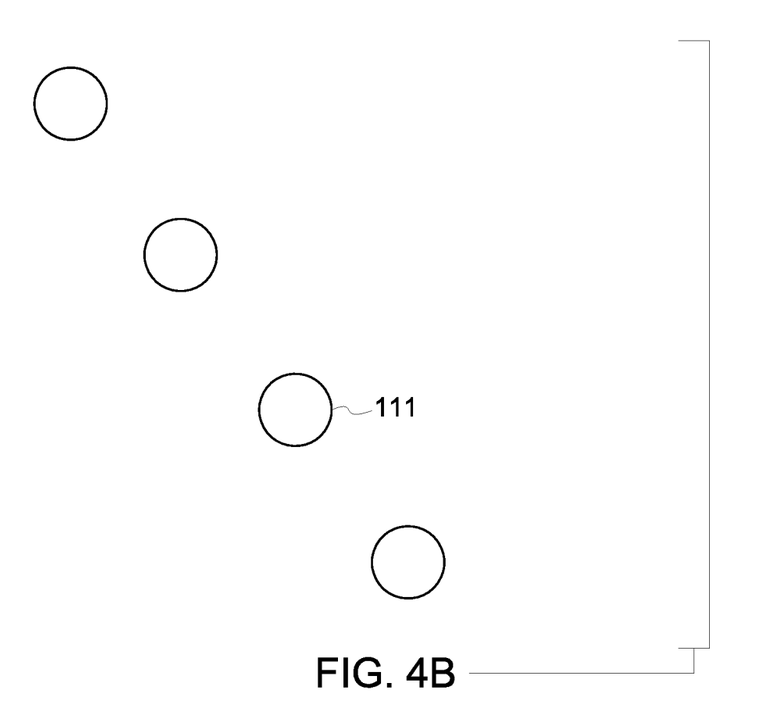
FIG. 4B schematically illustrates a fiber array usable with the system according to the present technology.
Figure 4C:
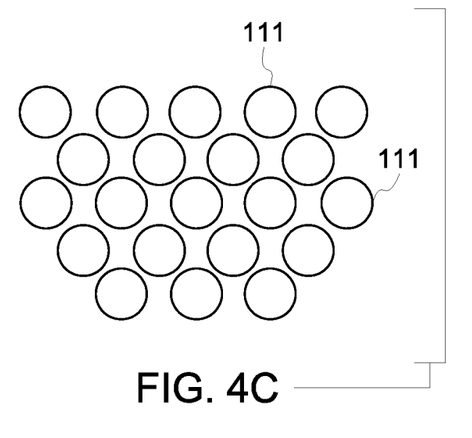
FIG. 4C schematically illustrates another fiber array usable with the system according to the present technology.
Figure 4D:
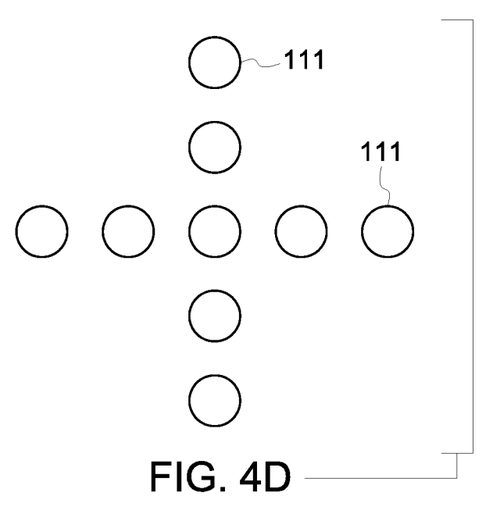
FIG. 4D schematically illustrates another fiber array usable with the system according to the present technology.

Referring to FIGS. 4A-4D, to achieve the desired contouring about the outer boundary 26 of each layer 60, the array of fibers 18 of the first diode laser fiber array 10 may be linear as shown in FIG. 4A, arranged in a line at a particular angle (staggered) as shown in FIG. 4B, in a close-packed arrangement as shown in FIG. 4C, or in intersecting lines as shown in FIG. 4D. Other arrays, for example hexagonal, may be used. It should also be appreciated that the first diode laser fiber array 10 may be configured having closer spacing between the lasers than that of the interior hatching lasers 12 of the second diode laser fiber array 50, and could be at various power levels, and optimized to the material and build speed. As an example, the lasers 12 of the first diode laser fiber array 10 that scan the outer boundary 26 of each layer 60 of the part 30 are physically arranged to give both an optimal spacing between laser spots, and an optimal timing if offset in the same direction as the scan.

By utilizing a diode laser fiber array configured to improve the resolution and surface finish of the build part, both one-dimensional and two-dimensional lasers can be used in DMLM to achieve low cost manufacturing, while still maintaining quality of the build. The commercial advantages for diode laser fiber array systems include fewer required systems to produce the same amount of parts as current systems and tailoring power bed systems to the size of the parts of interest. The technology disclosed herein may also be used in sintering, for example direct metal laser sintering.

It is to be understood that not necessarily all such objects or advantages described above may be achieved in accordance with any particular example. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

While only certain features of the present technology have been illustrated and described herein, many modifications and changes will occur to those skilled in the art. It is, therefore, to be understood that the appended claims are intended to cover all such modifications and changes.

The invention claimed is:

1. An apparatus for forming a build in a powder bed, comprising:
    a first diode laser fiber array comprising a plurality of diode lasers and a plurality of optical fibers corresponding to the plurality of diode lasers, each optical fiber configured to receive a laser beam from a respective diode laser and configured to emit the laser beam;
    a second diode laser fiber array comprising a plurality of diode lasers and a plurality of optical fibers corresponding to the plurality of diode lasers, each optical fiber configured to receive a laser beam from a respective diode laser and configured to emit the laser beam;
    a support configured to support a powder bed or a component configured to support the powder bed at a distance from ends of the optical fibers of the first diode laser fiber array and the second diode laser fiber array; and
    a controller configured to control the second diode laser fiber array to emit a plurality of laser beams from selected fibers of the second diode laser fiber array onto the powder bed, the selected fibers of the second diode laser fiber array corresponding to a pattern of a layer of the build and simultaneously melt the powder in the powder bed corresponding to the pattern of the layer of the build,
    the controller configured to control the first diode laser fiber array to emit a plurality of laser beams from selected fibers of the first diode laser fiber array onto an outer boundary of the layer of the build in the powder bed, the selected fibers of the first diode laser fiber array corresponding to the outer boundary of the layer of the build and simultaneously melt the powder in the powder bed.

2. The apparatus according to claim 1, wherein the first diode laser fiber array and the second diode laser fiber array comprise a single diode laser fiber array.

3. The apparatus according to claim 1, wherein the controller is further configured to control at least one of a duration of each laser beam of the first diode laser fiber array, a pulse energy of each diode laser of the first diode laser fiber array, a pulse width of each diode laser of the first diode laser fiber array, an average output power of each diode laser of the first diode laser fiber array, an energy distribution of each laser beam of the first diode laser fiber array, power density of each laser beam of the first diode laser fiber array, a rate of reduction of the power of each laser beam of the first diode laser fiber array, and/or a distance of ends of fibers of the first diode laser fiber array from the powder bed.

4. The apparatus according to claim 1, wherein the controller is further configured to control at least one of a duration of each laser beam of the second diode laser fiber array, a pulse energy of each diode laser of the second diode laser fiber array, a pulse width of each diode laser of the second diode laser fiber array, an average output power of each diode laser of the second diode laser fiber array, an energy distribution of each laser beam of the second diode laser fiber array, power density of each laser beam of the second diode laser fiber array, a rate of reduction of the power of each laser beam of the second diode laser fiber array, and/or a distance of ends of fibers of the second diode laser fiber array from the powder bed.

5. The apparatus according to claim 1, wherein the array of fibers of the first diode laser fiber array are one of arranged linearly, arranged in a staggered line, in a close-packed arrangement or arranged in intersecting lines.

6. The apparatus according to claim 1, wherein a spacing between the diode laser fibers of the first diode laser fiber array is less than a spacing between the diode laser fibers of the second diode laser fiber array.

7. The apparatus according to claim 1, wherein the plurality of diode laser fibers of the first diode laser fiber array is less than the plurality of diode laser fibers of the second diode laser fiber array.

8. The apparatus according to claim 1, wherein a diameter of each of the diode laser fibers of the first diode laser fiber array is less than a diameter of each of the diode laser fibers of the second diode laser fiber array.

9. The apparatus according to claim 1, wherein an average output power of each diode laser of the first diode laser fiber array is between about 2 W to about 60 W.

10. The apparatus according to claim 1, wherein a power density of each laser beam of the first diode laser fiber array is about 1,000,000 W/cm$^2$.

11. The apparatus according to claim 1, wherein the apparatus is configured such that the powder is metal, ceramic, glass, or plastic.

12. The apparatus according to claim 1, wherein a thickness of the layer of the build is between about 1 μm to about 1 mm.

13. The apparatus according to claim 1, wherein the apparatus is configured such that the build is a repair of a component.

14. The apparatus according to claim 13, wherein the apparatus is configured such that the component is an airfoil of a turbine.

15. An apparatus for forming a build in a powder bed, comprising:
 a first diode laser fiber array comprising a plurality of diode lasers and a plurality of optical fibers corresponding to the plurality of diode lasers, each optical fiber configured to receive a laser beam from a respective diode laser and configured to emit the laser beam;
 a second diode laser fiber array comprising a plurality of diode lasers and a plurality of optical fibers corresponding to the plurality of diode lasers, each optical fiber configured to receive a laser beam from a respective diode laser and configured to emit the laser beam;
 a support configured to support a powder bed or a component configured to support the powder bed at a distance from ends of the optical fibers of the first diode laser fiber array and the second diode laser fiber array; and
 a controller configured to control the second diode laser fiber array to emit a plurality of laser beams from selected fibers of the second diode laser fiber array onto the powder bed, the selected fibers of the second diode laser fiber array corresponding to a pattern of a layer of the build and simultaneously melt the powder in the powder bed corresponding to the pattern of the layer of the build,
 the controller configured to control the first diode laser fiber array to emit a plurality of laser beams from selected fibers of the first diode laser fiber array onto an outer boundary of the layer of the build in the powder bed, the selected fibers of the first diode laser fiber array corresponding to the outer boundary of the layer of the build and simultaneously melt the powder in the powder bed, wherein the first diode laser fiber array and the second diode laser fiber array are each independently operable with respect to the other.

16. The apparatus according to claim 15, wherein the controller is further configured to control at least one of a duration of each laser beam of the first diode laser fiber array and the second diode laser fiber array, a pulse energy of each diode laser of the first diode laser fiber array and the second diode laser fiber array, a pulse width of each diode laser of the first diode laser fiber array and the second diode laser fiber array, an average output power of each diode laser of the first diode laser fiber array and the second diode laser fiber array, an energy distribution of each laser beam of the first diode laser fiber array and the second diode laser fiber array, power density of each laser beam of the first diode laser fiber array and the second diode laser fiber array, a rate of reduction of the power of each laser beam of the first diode laser fiber array and the second diode laser fiber array, and/or a distance between ends of the optical fibers of the first diode laser fiber array and the second diode laser fiber array from the powder bed.

17. An apparatus for forming a build in a powder bed, comprising:
 a first diode laser fiber array comprising a plurality of diode lasers and a plurality of optical fibers corresponding to the plurality of diode lasers, each optical fiber configured to receive a laser beam from a respective diode laser and configured to emit the laser beam;
 a second diode laser fiber array comprising a plurality of diode lasers and a plurality of optical fibers corresponding to the plurality of diode lasers, each optical fiber configured to receive a laser beam from a respective diode laser and configured to emit the laser beam;
 a support configured to support a powder bed or a component configured to support the powder bed at a distance from ends of the optical fibers of the first diode laser fiber array and the second diode laser fiber array; and
 a controller configured to control the second diode laser fiber array to emit a plurality of laser beams from selected fibers of the second diode laser fiber array onto the powder bed, the selected fibers of the second diode laser fiber array corresponding to a pattern of a layer of the build and simultaneously melt the powder in the powder bed corresponding to the pattern of the layer of the build,
 the controller configured to control the first diode laser fiber array to emit a plurality of laser beams from selected fibers of the first diode laser fiber array onto an outer boundary of the layer of the build in the powder bed, the selected fibers of the first diode laser fiber array corresponding to the outer boundary of the layer of the build and simultaneously melt the powder in the powder bed, wherein a spacing between the plurality of diode lasers of the first diode laser fiber array is different than a spacing between the plurality of diode lasers of the second diode laser fiber array.

18. The apparatus according to claim 17, wherein a spacing between the diode laser fibers of the first diode laser fiber array is less than a spacing between the diode laser fibers of the second diode laser fiber array.

19. The apparatus according to claim 17, wherein the plurality of diode laser fibers of the first diode laser fiber array is less than the plurality of diode laser fibers of the second diode laser fiber array.

20. The apparatus according to claim 17, wherein a diameter of each of the diode laser fibers of the first diode laser fiber array is less than a diameter of each of the diode laser fibers of the second diode laser fiber array.

\* \* \* \* \*